United States Patent
Ito

(10) Patent No.: US 9,099,675 B2
(45) Date of Patent: Aug. 4, 2015

(54) LIGHT EMITTING APPARATUS, IMAGE FORMING APPARATUS, DISPLAY APPARATUS, AND IMAGE PICKUP APPARATUS

(71) Applicant: CANON KABUSHIKI KAISHA, Tokyo (JP)

(72) Inventor: Takayuki Ito, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 13/753,164

(22) Filed: Jan. 29, 2013

(65) Prior Publication Data

US 2013/0194477 A1    Aug. 1, 2013

(30) Foreign Application Priority Data

Jan. 31, 2012    (JP) ................. 2012-018816

(51) Int. Cl.
*H01L 51/52* (2006.01)
*G03G 15/04* (2006.01)
*H01L 51/00* (2006.01)

(52) U.S. Cl.
CPC ...... *H01L 51/5234* (2013.01); *G03G 15/04036* (2013.01); *G03G 15/04054* (2013.01); *H01L 51/5265* (2013.01); *H01L 51/0058* (2013.01); *H01L 51/0085* (2013.01)

(58) Field of Classification Search
None
See application file for complete search history.

(56) References Cited

U.S. PATENT DOCUMENTS

| 2003/0044639 A1* | 3/2003 | Fukuda ................... 428/690 |
| 2006/0158098 A1* | 7/2006 | Raychaudhuri et al. ...... 313/503 |
| 2006/0192220 A1* | 8/2006 | Nishikawa et al. ............ 257/98 |
| 2007/0046183 A1* | 3/2007 | Kwok et al. .................. 313/504 |

FOREIGN PATENT DOCUMENTS

| CN | 100361311 C | 1/2008 |
| JP | 2005-285395 A | 10/2005 |

OTHER PUBLICATIONS

Improved hole-injection contact for top-emitting polymeric diodes, Li et al. ; published online Apr. 24, 2007.*

* cited by examiner

*Primary Examiner* — Britt D Hanley
(74) *Attorney, Agent, or Firm* — Canon USA Inc IP Division

(57) ABSTRACT

A light emitting apparatus having organic EL elements is provided. The first optical length $L_1$ between the emission point of the light emitting layer and the reflection surface of the first electrode, satisfies the following formula: $L_1 > 0$, $(\lambda/8) \times (-1 - 2\Phi_1/\pi) < L_1 < (\lambda/8) \times (1 - 2\Phi_1/\pi)$, where $\lambda$ denotes the wavelength of the highest peak in the emission spectrum of the organic EL element, and $\Phi_1$ denotes the phase shift at the reflection surface of the first electrode at the wavelength $\lambda$. The first electrode has a first layer and a second layer. The first layer contains Al and is connected to a transistor, and the second layer covers the first layer and contains Mo and/or W.

19 Claims, 4 Drawing Sheets

LIGHT EMITTING APPARATUS, IMAGE FORMING APPARATUS, DISPLAY APPARATUS, AND IMAGE PICKUP APPARATUS

BACKGROUND OF THE INVENTION

1. Field of the Invention

The present invention relates to a light emitting apparatus, an image forming apparatus, a display apparatus, and an image pickup apparatus incorporating organic EL (electroluminescent) elements.

2. Description of the Related Art

There have recently been increasing demand for organic EL displays with reduced power consumption and growing expectation for organic EL elements with improved emission efficiency. An organic EL element is composed of a light-reflective electrode, an organic compound layer, and an optically transmissive electrode stacked on top of one another, and its emission efficiency can be improved by adjusting the thickness of the organic compound layer and other characteristics and utilizing the resultant light interference effect, for example (Japanese Patent Laid-Open No. 2005-285395).

More specifically, the optical length L between the light-reflective electrode and the emission point of the organic EL element is set to satisfy formula 1, where $\lambda$ is the wavelength to be enhanced, $\Phi$ is the sum of the phase shifts that occur when the light reflects off the light-reflective electrode, and m is an integer of zero or greater. The light interference effect is maximized when m is zero.

$$L=\{2m-(\Phi/\pi)\}\times(\lambda/4) \qquad \text{Formula 1}$$

A typical configuration of the light-reflective electrode is that found in Japanese Patent Laid-Open No. 2005-285395, i.e., a laminate consisting of a 100-nm Al-based metallic reflective sheet and a 100-nm ITO cathode formed on the metallic sheet. This publication also discloses that the contact resistance between the Al-containing metallic compound and ITO is high and thus the cathode may be directly connected to a thin film transistor (TFT) via a contact hole so that the organic EL element can operate.

However, making the thickness of such an ITO layer as large as 100 nm causes the organic compound layer to be too thin to completely cover the protrusions and depressions or any foreign particulate matter on the surface of the light-reflective electrode when the optical length L of the organic EL element is set to satisfy formula 1 with m equal to zero. A short-circuit or current leakage would occur between the electrodes, and the organic EL element would become incapable of emitting light.

A possible solution to this problem is to reduce the thickness of the ITO layer, but this also leads to an increased sheet resistance of the ITO layer and an accordingly increased driving voltage of the organic EL element.

Omitting the ITO layer causes the surface of the Al-based metallic layer to be more susceptible to oxidation. The Al-based metallic layer would be coated with aluminum oxide during the etching process for forming an electrode pattern or while the substrate and electrode surfaces are cleaned. The insulating aluminum oxide layer would interfere with the injection of charges into the organic compound layer, increasing the driving voltage of the organic EL element.

SUMMARY OF THE INVENTION

An aspect of the present invention provides a light emitting apparatus that incorporates organic EL elements having their optical length set to satisfy formula 1 with m equal to zero and can operate at a low driving voltage.

An aspect of the present invention is a light emitting apparatus having a substrate, organic EL elements, and transistors. Each organic EL element has a first electrode, a light emitting layer, and a second electrode and is formed on the substrate. Each transistor is connected to the first electrode of each organic EL element and is also formed on the substrate. Each organic EL element has a first optical length $L_1$, which is the optical distance between the emission point of the light emitting layer and the reflection surface of the first electrode and satisfies formula A. The first electrode has a first layer and a second layer. The first layer contains Al and is connected to one of the transistors, and the second layer covers the first layer and contains Mo and/or W.

$$L_1>0, (\lambda/8)\times(-1-2\Phi_1/\pi)<L_1<(\lambda/8)\times(1-2\Phi_1/\pi) \qquad \text{Formula A}$$

where $\lambda$ denotes the wavelength of the highest peak in the emission spectrum of each organic EL element, and $\Phi_1$ denotes the phase shift at the reflection surface of the first electrode at the wavelength $\lambda$.

The light emitting apparatus configured in this way is advantageous in that organic EL elements having their optical length set to satisfy formula 1 with m equal to zero can operate at a reduced driving voltage.

Further features of the present invention will become apparent from the following description of exemplary embodiments with reference to the attached drawings.

DESCRIPTION OF THE EMBODIMENTS

Figure 1:
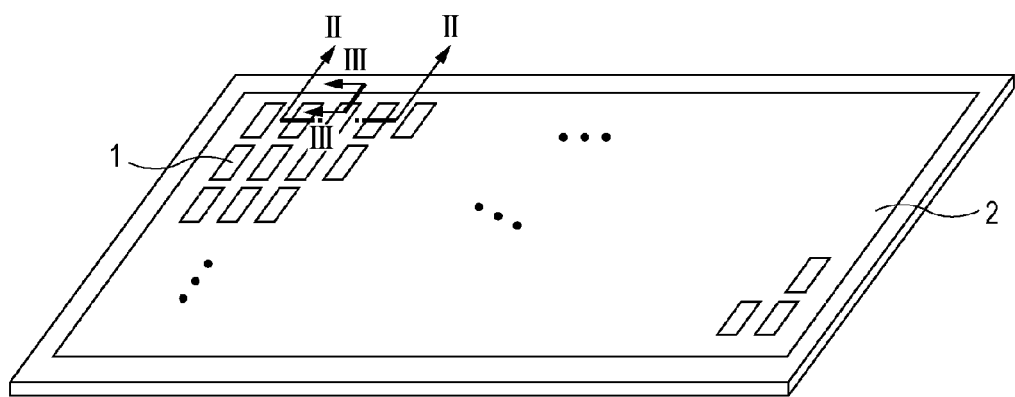
FIG. 1 is a schematic perspective view of a light emitting apparatus according to an aspect of the present invention.

The following describes some embodiments of the present invention with reference to the attached drawings. These embodiments should not be construed as limiting any aspect of the invention. The components not illustrated in the drawings or not described herein should be understood by applying known techniques in the prior art.

FIG. 1 is a schematic perspective view of a light emitting apparatus according to an embodiment of the present invention. This light emitting apparatus has pixels 1 each having an organic EL element, and these pixels 1 are arranged in a matrix to form a display area 2. The term pixel, as used herein, refers to an area corresponding to the emission area of one light emitting element. In this light emitting apparatus the light emitting element is an organic EL element, and one monochromatic organic EL element occupies each pixel 1. The color of the light emitted by each organic EL element may be red, green, or blue, white, yellow, or cyan, or any other appropriate color. A set of pixels of different colors (e.g., pixels emitting red light, green light, and blue light) constitute a pixel unit, and an array of pixel units is used in this light emitting apparatus. The term pixel unit, as used herein, denotes a minimum set of pixels that can emit light of any desired color by color blending. However, this light emitting apparatus may be configured using a number of pixels of the same color arranged in a row when it is used in a printhead, for example.

Figure 2:
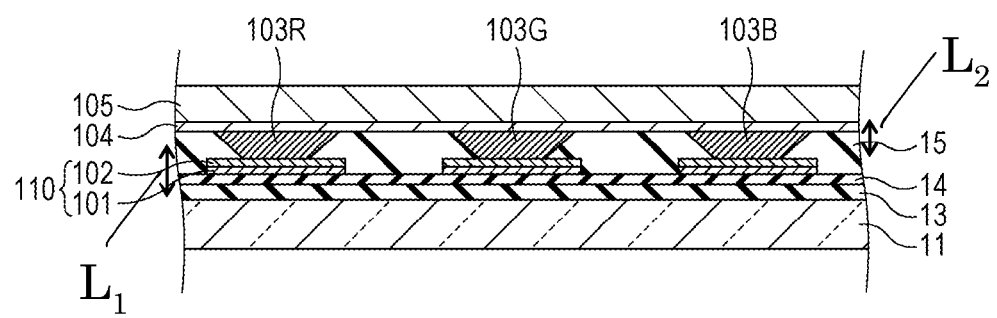
FIG. 2 is a schematic cross-sectional view of the light emitting apparatus of FIG. 1 taken along line II-II.
Figure 3:
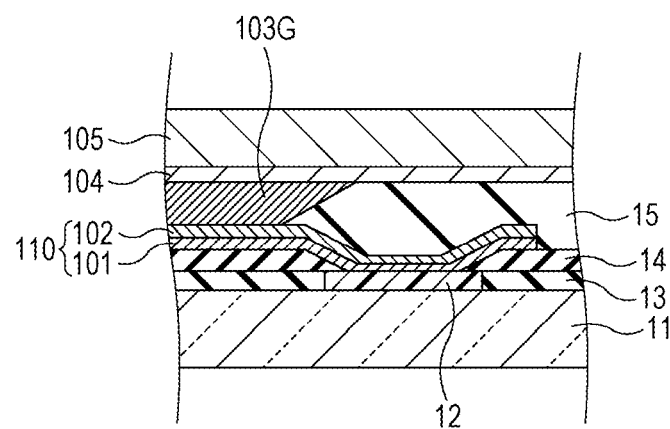
FIG. 3 is a schematic cross-sectional view of the light emitting apparatus of FIG. 1 taken along line III-III.

FIG. 2 is a partial schematic cross-sectional view taken along line II-II of FIG. 1, and FIG. 3 is a partial schematic cross-sectional view taken along line III-III of FIG. 1. As illustrated in FIG. 2, one pixel 1 has an organic EL element formed on a substrate 11 and composed of a first electrode (cathode) 110, an organic compound layer 103R, 103G, or 103B, and a second electrode (anode) 104. Each of the organic EL elements used in this embodiment has a reflection surface on the first electrode 110, and the light emitted from the light emitting layer toward the first electrode 110 reflects off this surface and goes out through the second electrode 104.

Between the substrate 11 and the first electrode 110 a transistor 12 is interposed for supplying electric current to the organic EL element as illustrated in FIG. 3, and is connected to the first electrode 110. More specifically, the source or drain electrode of the transistor 12 is connected to the first electrode 110. The transistor 12 is covered with a first insulating layer 13 and a second insulating layer 14. The first insulating layer 13 and the second insulating layer 14 both have an opening formed above the transistor 12, and this opening is the place where the first electrode 110 and the transistor 12 are connected. In addition to these, a third insulating layer 15 is formed to cover the opening.

The organic compound layers 103R, 103G, and 103B illustrated in FIG. 2 emit red light, green light, and blue light, respectively. These organic compound layers 103R, 103G, and 103B contain a red-light emitting layer, a green-light emitting layer, and a blue-light emitting layer, respectively, and a pattern is formed on each of these light emitting layers to make one pixel that can emit red, green, or blue light (one organic EL element). The organic compound layers 103R, 103G, and 103B may have one or two or more additional layers, such as a hole transport layer and an electron transport layer, besides the light emitting layer. If a hole transport layer and/or an electron transport layer is formed, it may be divided to correspond to the respective pixels (organic EL elements) or used as a whole to cover several pixels, and it is also allowed that these two configurations are mixed.

The first electrode 110 is isolated from the first electrode 110 of the next pixel (organic EL element) and therefore is unique to each pixel (organic EL element). The second electrode 104 may be shared with the next pixel or patterned uniquely to each pixel. The edge of the first electrode 110 is covered with the third insulating layer 15 so that a short-circuit should not occur between the first electrode 110 and the second electrode 104.

Each of the organic EL elements used in this embodiment may further have an optical adjustment layer 105 on the second electrode 104. The thickness of this optical adjustment layer 105, which may be made of an organic or inorganic material, can be adjusted so that the light interference effect can be enhanced and thereby the emission efficiency of the organic EL element can be improved. Furthermore, the organic EL elements used in this embodiment are covered with a sealing glass sheet (not illustrated in the drawings) to keep away moisture and oxygen.

The organic EL elements used in this embodiment each have a first optical length $L_1$. It is the optical distance between the emission point of the organic compound layer 103R, 103G, or 103B and the reflection surface of the first electrode 110 and is set to satisfy formula 2.

$$L_1 = -(\Phi_1/\pi) \times (\lambda/4) \quad \text{Formula 2}$$

where $\lambda$ denotes the wavelength of the highest peak in the emission spectrum of the organic EL element, and $\Phi_1$ denotes the phase shift at the first electrode 110 at the wavelength $\lambda$.

In general, the phase shift ($\phi$) at a reflection surface can be represented by formula 3, where the optical constants of one of the materials involved from which the light is incident are $(n_1, k_1)$ and those of the other, upon which the light is incident, are $(n_2, k_2)$. These optical constants can be measured using a spectroscopic ellipsometer or other suitable instruments. As can be seen from the formula, the phase shift $\Phi_1$ is negative.

$$\phi = \tan^{-1}\{2n_1 k_2/(n_1^2 - n_2^2 - k_2^2)\} \quad \text{Formula 3}$$

Formula 2 can be satisfied by forming a hole transport layer with an appropriate thickness in each organic EL element, providing a hole transport layer to some of the organic EL elements and not to the others, or other approaches.

There may be some cases where formula 2 cannot be satisfied because of errors that occur during the formation of the organic compound layer or the influence of the light emission distribution in the light emitting layer. However, light with the wavelength $\lambda$ is enhanced as long as the first optical length $L_1$ is within a $\pm\lambda/8$ deviation from the value that satisfies formula 2.

In practice, therefore, the organic EL elements used in this embodiment are configured to satisfy formula 4, where $L_1$ should be greater than zero.

$$(\lambda/8) \times (-1 - 2\Phi_1/\pi) < L_1 < (\lambda/8) \times (1 - 2\Phi_1/\pi) \quad \text{Formula 4}$$

The first optical length $L_1$ may be within a $\pm\lambda/16$ deviation from the value that satisfies formula 2. In other words, the organic EL elements used in this embodiment can be configured to satisfy formula 5, where $L_1$ should be greater than zero.

$$(\lambda/16) \times (-1 - 4\Phi_1/\pi) \leq L_1 \leq (\lambda/16) \times (1 - 4\Phi_1/\pi) \quad \text{Formula 5}$$

Here, the first electrode 110 has a metallic layer, and the phase shift at this electrode is therefore approximately $-\pi$. Thus the organic EL elements may be configured to satisfy the following formulae, which are derived from formulae 4 and 5.

$$\lambda/8 < L_1 < 3\lambda/8 \quad \text{Formula 4'}$$

$$3\lambda/16 \leq L_1 \leq 5\lambda/16 \quad \text{Formula 5'}$$

In addition to this, the second optical length $L_2$, which is the optical distance between the emission point of the organic compound layer 103R, 103G, or 103B and the reflection surface of the second electrode 104, can be set to satisfy formula 6 so that the light interference effect can be enhanced.

$$L_2 = -(\Phi_2/\pi) \times (\lambda/4) \quad \text{Formula 6}$$

where $\Phi_2$ denotes the phase shift at the second electrode 104 at the wavelength $\lambda$.

As with the above, there may be some cases where formula 6 cannot be satisfied because of errors that occur during the formation of the organic compound layer or the influence of the light emission distribution in the light emitting layer. However, light with the wavelength $\lambda$ is enhanced as long as the second optical length $L_2$ is within a $\pm\lambda/8$ deviation from the value that satisfies formula 6. The second optical length $L_2$ may be within a $\pm\lambda/16$ deviation from the value that satisfies formula 6. In other words, the organic EL elements used in this embodiment can be configured to satisfy formula 7 or 8, where $L_2$ should be greater than zero.

$$(\lambda/8)\times(-1-2\Phi_2/\pi)<L_2<(\lambda/8)\times(1-2\Phi_2/\pi) \quad \text{Formula 7}$$

$$(\lambda/16)\times(-1-4\Phi_2/\pi)\leq L_2\leq(\lambda/16)\times(1-4\Phi_2/\pi) \quad \text{Formula 8}$$

The second electrode 104 also has a metallic layer and the phase shift at this electrode is also approximately $-\pi$. Thus the organic EL elements may be configured to satisfy the following formulae derived from formulae 7 and 8.

$$\lambda/8<L_2<3\lambda/8 \quad \text{Formula 7'}$$

$$3\lambda/16\leq L_2\leq5\lambda/16 \quad \text{Formula 8'}$$

In this embodiment, furthermore, the first electrode 110 has a first layer 101 and a second layer 102 stacked in this order from the substrate side, with the former containing Al and the latter containing Mo and/or W. The Al containing first layer 101 extends from the emission area of the organic EL element to the transistor 12 and is in contact with the transistor 12. The second layer 102 covers the first layer 101.

This configuration prevents the Al layer, or the first layer 101, from oxidation. As a result, the emission efficiency of the organic EL element is improved with no increase in driving voltage even when the organic EL element is configured to satisfy formulae 2 and 4 to 8' for the maximum light interference effect.

The following describes the configuration of the first electrode 110 in more detail. As mentioned above, the first electrode 110 has a first layer 101 and a second layer 102 stacked on one another. The material for the first layer 101 can be Al, an Al alloy such as AlNd, or the like. The thickness of the first layer 101 can be any value in the range of 50 nm to 200 nm, both inclusive. This first layer 101 has two functions: a cathode that is connected to the transistor 12 and supplies holes to the organic EL element, and a light-reflective layer that reflects the light emitted by the organic compound layer 103R, 103G, or 103B of the organic EL element toward the second electrode 104. The connection between the first layer 101 and the transistor 12 may be indirect. For example, another metallic layer may be interposed between the first layer 101 and the transistor 12.

The surface of the Al containing layer is a readily oxidizable and the etching process for forming an electrode pattern or cleaning the substrate and electrode surfaces causes this layer to be coated with an aluminum oxide ($Al_2O_3$) layer with a thickness of several nanometers. If the first layer 101 was the only component of the first electrode 110, it would cause the hole injection barrier between the first electrode 110 and the organic compound layer 103R, 103G, or 103B to be increased and the driving voltage of the organic EL element to be accordingly higher because of the insulating properties of $Al_2O_3$.

This is the reason why in this embodiment the second layer 102 containing Mo and/or W is used; it prevents the Al layer from oxidation. The high work functions of the materials Mo and W and the similarly high work functions of their oxides contribute to the reduction of the hole injection barrier at the organic compound layer 103R, 103G, or 103B. The thickness of the second layer 102 can be in the range of 2 nm to 9 nm, both inclusive, because of the low reflectivity of this metallic layer made of Mo and/or W. This ensures that the first layer 101 can be prevented from oxidation while a sufficiently high reflectivity is maintained. The thickness of the second layer 102 may be in the range of 2 nm to 6 nm, both inclusive, so that the reflectivity for blue light (wavelength: 450 nm) can be as high as 80% or more.

The second layer 102 may be composed of a metallic film containing Mo and/or W (a Mo/W metallic film) and an oxide film containing a molybdenum oxide and/or a tungsten oxide (a Mo/W oxide film) formed in this order from the first layer 101 side. This further reduces the hole injection barrier at the organic compound layer 103R, 103G, or 103B because the work functions of the oxides of Mo and W are higher than those of pure Mo and W. Furthermore, the oxides of Mo and W are more optically transmissive and thus less affect the reflectivity of the first electrode 110 than pure Mo and W. Forming the Mo/W oxide film directly on the first layer 101 is undesirable because it causes the Al containing surface to be oxidized; the Mo/W oxide film can be formed after the Mo/W metallic film. The thickness of the Mo/W oxide film can be in the range of 1 nm to 5 nm, both inclusive, as this facilitates the injection of holes with little loss of the reflectivity of the first electrode 110. As for the Mo/W metallic film, a thickness equal to or greater than 2 nm is sufficient for the prevention of the oxidation of the first layer 101.

It is also allowed that another metallic layer is interposed between the first electrode 110 and the second insulating layer 14 for more intimate contact between them. This metallic layer can be a conductive oxide layer made of indium tin oxide, indium zinc oxide, or the like, a pure metal such as Mo, W, or Ti, or an alloy of these metals.

The second layer 102 covers the first layer 101. More specifically, the second layer 102 covers the area in which the first layer 101 is formed; the first layer 101 extends from the emission area of the organic EL element to the transistor 12, and the second layer 102 is formed on this first layer 101. What is needed here is that the transistor 12 and the first layer 101 are connected directly or via another metallic layer interposed between the transistor 12 and the first layer 101. As long as this requirement is met, it does not matter whether a portion of the second layer 102 is directly connected to the transistor 12 or whether a portion of the second layer 102 is connected to another metallic layer interposed between the transistor 12 and the first layer 101.

The first layer 101 and the second layer 102 can be simultaneously patterned for the prevention of the oxidation of the first layer 101, and the second layer 102 can be shaped into the same pattern as the first layer 101 for this purpose. Thus, the second layer 102 need not extend to the sides of the first layer 101. The electrical current path from the transistor 12 to the emission area of the organic EL element is free from the formation of a high-resistance film regardless of whether the sides of the first layer 101 are covered or exposed.

In addition, the reflection surface of the first electrode 110 is the interface between the first electrode 110 and the organic compound layer 103R, 103G, or 103B.

The substrate 11 can be a glass substrate, a semiconductor substrate, a metallic substrate, or a substrate made of any other suitable material. It may be rigid or flexible.

As for the transistor 12, examples of materials include polysilicon, amorphous silicon, and so forth.

Examples of the materials for the first insulating layer 13 include silicon nitride, silicon oxide, silicon oxide-nitride, and other inorganic insulating substances. The thickness of the first insulating layer 13 can be any value in the range of 100 nm to 1 μm, both inclusive. This first insulating layer 13 may double as the second insulating layer 14.

Examples of the materials for the second insulating layer 14 include resins such as polyimides and acrylic resin and inorganic substances such as silicon nitride. The protrusions and depressions on the surface of the transistor 12 are masked when the second insulating layer 14 is made of a resin material. However, the second insulating layer 14 can be polished until the surface is flat even when the second insulating layer 14 is made of an inorganic substance. The thickness of the second insulating layer 14 can be any value in the range of 300 nm to 10 µm, both inclusive, when a resin material is used, and any value in the range of 100 nm to 1 µm, both inclusive, when an inorganic substance is used.

As for the third insulating layer 15, examples of materials and the range of thickness are the same as those for the second insulating layer 14. The third insulating layer 15 can be omitted if there is no risk of a short-circuit between the first electrode 110 and the second electrode 104, or more specifically in the case where the first electrode 110 is covered with the organic compound layer 103R, 103G, or 103B including its sides, for example. It does not matter whether the third insulating layer 15 extends to the transistor 12 or not.

The organic compound layer 103R, 103G, or 103B may have a hole transport layer and an electron transport layer besides the light emitting layer, as mentioned above.

When a hole transport layer is used, it is made of a material that carries holes rather than electrons. Examples include tertiary amine derivatives and carbazole derivatives, such as 4,4'-bis[N-(1-naphthyl)-N-phenylamino]biphenyl. The number of hole transport layers is not limited to one. When two or more hole transport layers are used, it is allowed that a layer with high hole injection properties is placed on the first electrode 110 side, and it is also allowed that a layer with high electron or exciton blocking properties is placed on the light emitting layer side. The hole transport layer or each of the hole transport layers may be composed of a combination of materials.

When an electron transport layer is used, it is made of a material that carries electrons rather than holes. Examples include heterocyclic compound derivatives, polycyclic hydrocarbon derivatives, and metal complexes, such as bathocuproine, bathophenanthroline, and so forth. The number of electron transport layers is not limited to one. When two or more electron transport layers are used, it is allowed that a layer with high hole or exciton blocking properties is placed on the light emitting layer side, and it is also allowed that a layer with high electron injection properties is placed on the second electrode 104 side. The electron transport layer or each of the electron transport layers may be composed of a combination of materials. Adding an alkali metal such as Li or Cs, an alkaline-earth metal such as Mg, and/or a compound containing an alkali metal or an alkaline-earth metal enhances the electron injection properties.

As for the light emitting layer, the material may be a fluorescent or phosphorescent material. The light emitting layer may be composed of a host material and an emitting dopant. If this configuration is used, the amount of the emitting dopant can be in the range of 0.01% by weight to 10% by weight, both inclusive, relative to the host material. The host material can be a pyrene derivative, a naphthalene derivative, an anthracene derivative, a carbazole derivative, or any other suitable compound, and the emitting dopant can be a fluorescent or phosphorescent material, whichever is appropriate. Besides the host material and the emitting dopant, the light emitting layer may further contain an auxiliary dopant. The concentration of the auxiliary dopant, if it is used, in the light emitting layer can be lower than that of the host material and higher than that of the emitting dopant.

Materials having an emission spectrum with the highest peak at any wavelength in the range of 420 nm to 470 nm, both inclusive, can be used as blue-light emitting dopants. Materials having an emission spectrum with the highest peak at any wavelength in the range of 500 nm to 550 nm, both inclusive, can be used as green-light emitting dopants, and materials having an emission spectrum with the highest peak at any wavelength in the range of 610 nm to 650 nm, both inclusive, can be used as red-light emitting dopants.

The emission point of the light emitting layer refers to the area in the light emitting layer with the highest emission intensity. When the light emitting layer contains a host material and an emitting dopant, for example, this emission point is determined by the relationship between the highest occupied molecular orbital (HOMO) and lowest unoccupied molecular orbital (LUMO) energy levels of the host material and those of the emitting dopant.

In the following the HOMO and LUMO energy levels of the host material in the light emitting layer are denoted as $H_H$ and $L_H$, respectively, and those of the emitting dopant as $H_D$ and $L_D$, respectively. When formula 9 is satisfied, the light emitting layer has its emission point on the hole transport layer(s) side with respect to its center, or more specifically the light emitting point is located near the interface between the light emitting layer and the (closest) hole transport layer (10 nm away from the interface).

$$|H_D| < |H_H|, |H_H| - |H_D| > |L_D| - |L_H| \qquad \text{Formula 9}$$

In the light emitting layer configured to satisfy formula 9, holes are more likely to be trapped by the emitting dopant and the hole mobility is small. The probability of hole-electron recombination is higher on the hole transport layer(s) side and, as a result, the emission intensity is higher on the hole transport layer(s) side.

When formula 10 is satisfied, the light emitting layer has its emission point on the electron transport layer(s) side with respect to its center, or more specifically the light emitting point is located near the interface between the light emitting layer and the (closest) electron transport layer (5 nm away from the interface).

$$|L_D| > |L_H|, |L_D| - |L_H| > |H_H| - |H_D| \qquad \text{Formula 10}$$

In the light emitting layer configured to satisfy formula 10, electrons are more likely to be trapped by the emitting dopant and the electron mobility is small. The probability of hole-electron recombination is higher on the electron transport layer(s) side and, as a result, the emission intensity is higher on the electron transport layer(s) side.

The second electrode 104 is a monolayer or multilayer electrode, and the layer or each of the layers is made of Ag, Al, Ca, Mg, or their alloy. The second electrode 104 may be a laminate of a metallic layer made of any of the materials listed above and a conductive oxide layer. Ag is a high-reflectivity and low-absorption material, and thus the second electrode 104 may be a layer of Ag or an alloy containing Ag or consists of two or more layers each made of Ag or an alloy containing Ag. It is also allowed that the second electrode 104 consists of a metallic layer made of Ag or an alloy containing Ag and a conductive oxide layer stacked in this order from the organic compound layer 103R, 103G, or 103B side.

The thickness of the second electrode 104 can be selected so that the reflectivity for the light incident from the organic compound layer 103R, 103G, or 103B should be at least 50% over the visible range (400 nm to 800 nm, both inclusive). More specifically, the thickness of the second electrode 104 can be in the range of 15 nm to 35 nm, both inclusive.

In addition, the reflection surface of the second electrode 104 is the interface between the second electrode 104 and the organic compound layer 103R, 103G, or 103B.

The optical adjustment layer 105, if it is used, is formed on the second electrode 104. The light generated in the organic compound layer 103R, 103G, or 103B can be separately described in two components, the reflection from the second electrode 104 and the reflection from the surface of the optical adjustment layer 105 opposite to the interface with the second electrode 104. The interference between these two components can be used to adjust the reflectivity over the visible range and thereby improve the emission efficiency of the organic EL element. The power consumption of the light emitting apparatus can be reduced by a design in which the optical adjustment layer 105 controls the reflectivity at the range of 50%, inclusive, to less than 80% for the visible light incident from the organic compound layer 103R, 103G, or 103B into the second electrode 104.

When the optical adjustment layer 105 is used, it can be made of an organic or inorganic material with a transmittance equal to or higher than 90% over the visible range. Examples of materials include silicon oxide and silicon nitride, indium tin oxide and indium zinc oxide, and the substances used as materials for the organic compound layers 103R, 103G, and 103B in the organic EL elements.

The thickness of the optical adjustment layer 105 can be any value in the range of 50 nm to 300 nm, both inclusive, as appropriate for the purpose described above. The use of the optical adjustment layer 105 is optional.

The organic EL elements can be sealed with a sealing glass sheet or with the optical adjustment layer 105 and then with an inorganic sealing film. When a sealing film is used, it is a monolayer or multilayer film, and the layer or each of the layers is made of an inorganic material such as silicon nitride, silicon oxide, or aluminum oxide. The thickness of the sealing film is in the range of 100 nm to 10 μm, both inclusive.

The light emitting apparatus according to this embodiment can be used in image forming apparatuses such as laser printers, or more specifically the image forming apparatus having a photosensitive member on which the light emitting apparatus forms a latent image and a charging unit configured to charge the photosensitive member.

Although this embodiment describes a light emitting apparatus, aspects of the present invention include display apparatuses containing a number of organic EL elements. The organic EL elements used in these display apparatuses may be the same color or different colors. The display apparatus according to an aspect of the present invention can be used in the screen or electronic viewfinder of image pickup apparatuses such as digital still or video cameras having an image sensor like a CMOS sensor as well as in the screen of image forming apparatuses and mobile information terminals such as cellular phones or smartphones. It is also allowed that the display apparatus has a number of monochromatic organic EL elements and red, green, and blue color filters.

EXAMPLES

The following illustrates some examples of aspects of the present invention. The materials and element configurations used in these examples are for illustration purposes only and should not be construed as limiting any aspect of the invention.

Example 1

A cleaned glass substrate was coated with an 100-nm Al layer formed by sputtering and immediately, without exposure of the substrate to the air, Mo layers were formed with the following thicknesses and thereby five light-reflective electrodes A to E were prepared: 0.0 nm (no Mo layer formed), 2.1 nm, 3.5 nm, 7.1 nm, and 9.0 nm. The glass substrate carrying the light-reflective electrodes was then exposed to the air and washed in purified water.

Figure 4:
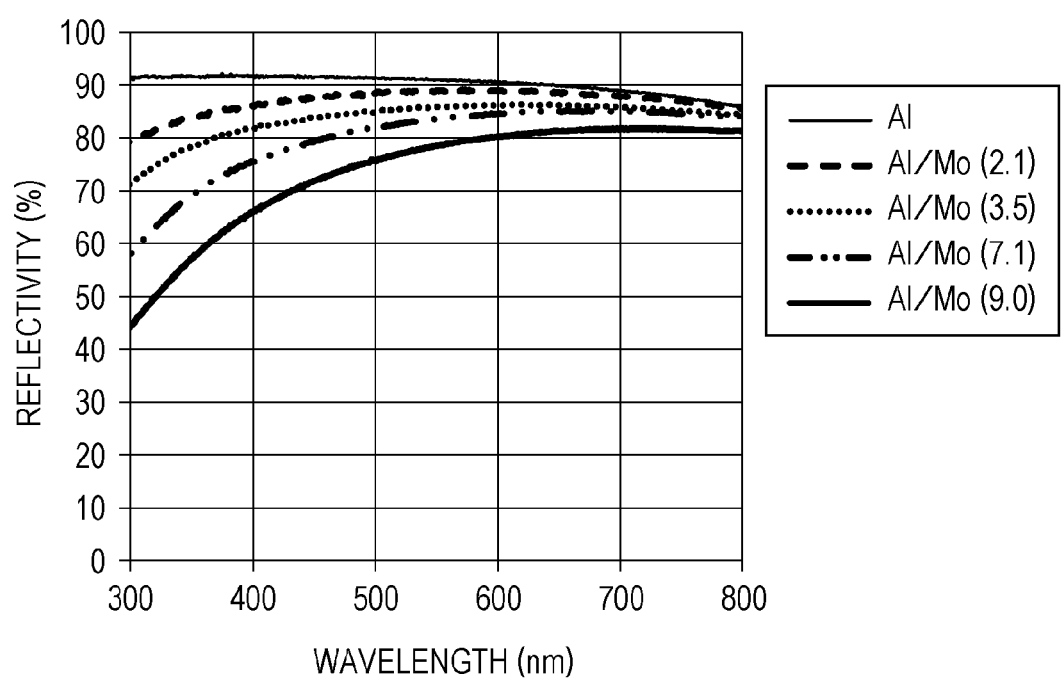
FIG. 4 is a graph plotting the reflectivity of laminates of an Al layer and a Mo layer with different proportions.
Figure 5:
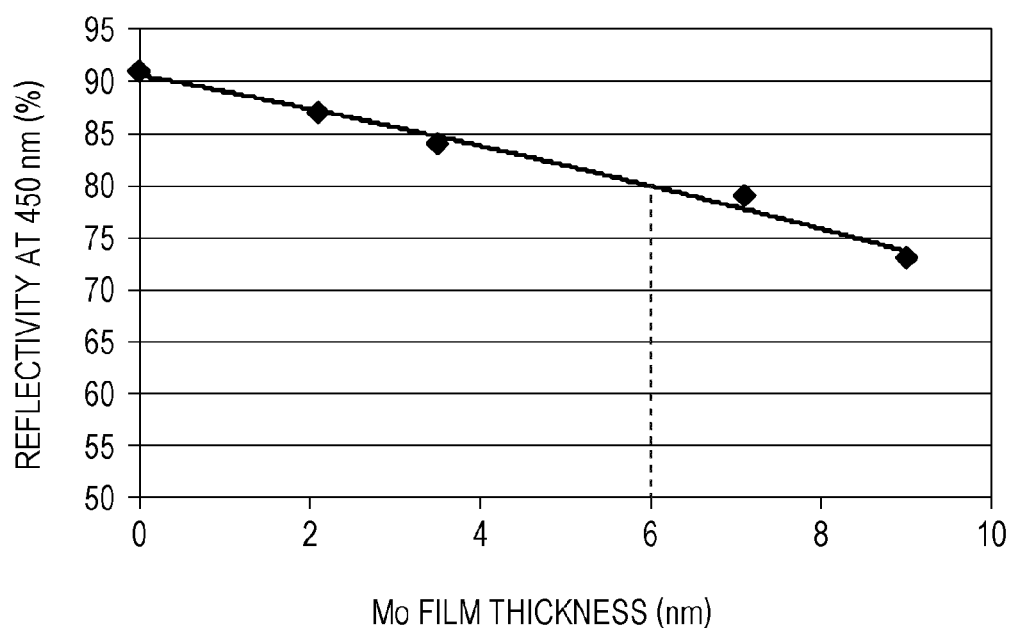
FIG. 5 is a graph plotting the reflectivity of laminates of an Al layer and a Mo layer with different proportions at a wavelength of 450 nm.

FIG. 4 shows the reflectivity of each light-reflective electrode over the wavelength range of 300 nm to 800 nm, both inclusive, and Table 1 and FIG. 5 show the reflectivity of each light-reflective electrode at 450 nm. As can be seen from FIG. 4, the reflectivity decreases with increasing the thickness of the Mo layer. However, as can be seen from FIG. 5, the reflectivity at a wavelength of 450 nm (blue light) is not less than 80% when the thickness of the Mo layer is equal to or smaller than 6 nm.

TABLE 1

|  | A | B | C | D | E |
|---|---|---|---|---|---|
| Mo film thickness (nm) | 0.0 | 2.1 | 3.5 | 7.1 | 9.0 |
| Reflectivity at 450 nm (%) | 91 | 87 | 84 | 79 | 73 |

Example 2

Blue organic EL elements were produced using the light-reflective electrodes prepared in Example 1 as the first electrode.

First, the glass substrate carrying light-reflective electrodes A to E was treated with UV and ozone under reduced pressure for 10 minutes and thereby its surface was cleaned.

Only light-reflective electrode A of Example 1 was coated with a 2.0-nm molybdenum oxide ($MoO_3$) layer as a hole injection layer in a vacuum deposition system.

Light-reflective electrode A with a coating $MoO_3$ layer and light-reflective electrodes B to E were then coated with a hole transport layer by vacuum deposition of a 25-nm film of compound 1. The pressure was $1.0 \times 10^{-4}$ Pa.

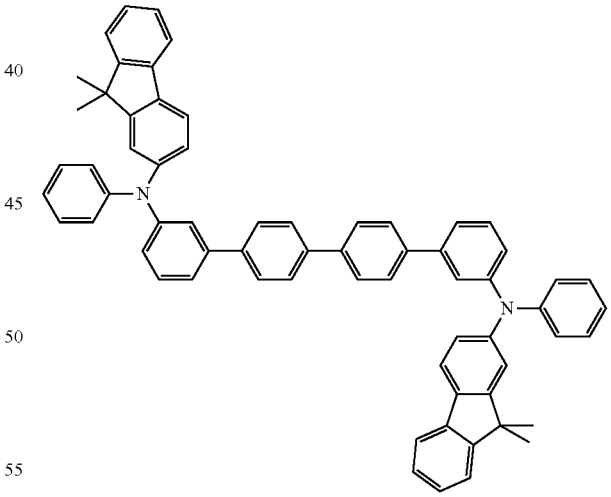

Compound 1

The substrate with this hole transport layer formed was then conveyed to the vacuum deposition system, and a light emitting layer was deposited on it by co-evaporation of compound 2 (a host material) and compound 3 (an emitting dopant) under a vacuum of $1.0 \times 10^{-4}$ Pa. The light emitting layer contained 1.0% by weight of compound 3 relative to compound 2 and its thickness was 20 nm. The combination of compounds 2 and 3 in the blue-light emitting layer satisfies formula 10. The light emitting point was therefore on the electron transport layer side.

Compound 2

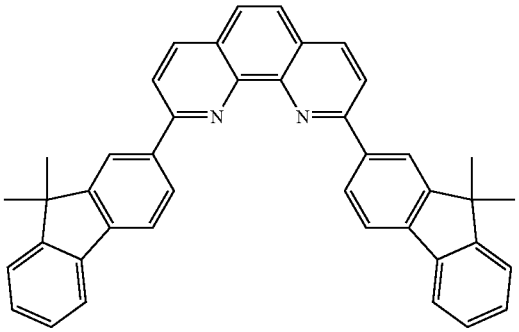

Compound 3

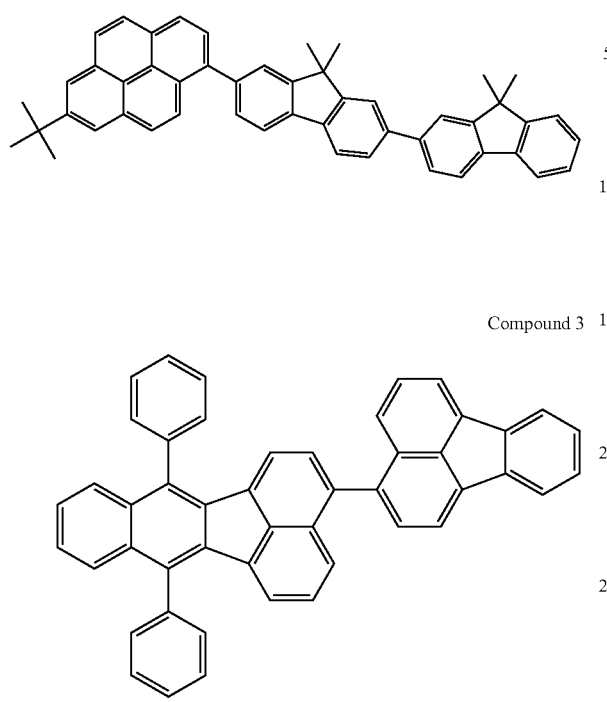

Subsequently, an exciton blocking layer was formed by depositing a 10-nm film of compound 4, an electron transport layer was formed by depositing a 10-nm film of compound 5, and then an electron injection layer was formed by depositing a 10-nm film containing compound 5 and 20% by weight of cesium carbonate by co-evaporation.

Compound 4

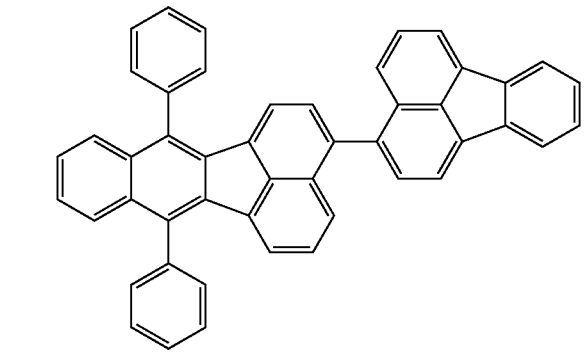

Compound 5

An optically semi-transmissive electrode was then formed as the second electrode by depositing a 25-nm Ag layer, and an optical adjustment layer was formed by depositing a 70-nm film of compound 5. In this way, organic EL elements were obtained.

These organic EL elements were then sealed by bonding a sealing glass sheet containing a desiccant to the film coated surface of the glass substrate with an epoxy resin adhesive in a nitrogen atmosphere in a glovebox.

Analysis of the obtained blue organic EL elements yielded the following result on the wavelength of the highest peak in the emission spectrum: $\lambda_B$=450 nm.

The first and second optical lengths of these blue organic EL elements were then calculated with the refractive index of the hole transport layer and the light emitting layer equal to 1.8 and was found to be 81.0 nm (25 nm×1.8+20 nm×1.8) and 72.0 nm (40 nm×1.8), respectively.

The first optical length according to formula 2 was then calculated with the phase shift $\Phi_1$ based on the refractive index and absorption coefficient on the first electrode 110 side equal to $-132°$ and $\lambda_B$ as 450 nm and was found to be 82.5 nm; it was almost equal to the first optical length of the obtained organic EL elements. Likewise, the second optical length according to formula 6 was then calculated with the phase shift $\Phi_2$ based on the refractive index and absorption coefficient on the second electrode 104 side equal to $-112°$ and $\lambda_B$ as 450 nm and was found to be 70.0 nm; it was almost equal to the second optical length of the obtained organic EL elements. Besides these, the configuration of Example 2 satisfied formulae 4, 5, 4', 5', 7, 8, 7', and 8'. The refractive indices and absorption coefficients used here are actual measurements in films of the relevant materials obtained using a spectroscopic ellipsometer.

Table 2 summarizes the EL characteristics of each blue organic EL element of Example 2 measured at a current density of 25 mA/cm².

TABLE 2

| | Light-reflective electrode | Hole injection layer | CIE chromaticity coordinates (x, y) | Current efficiency (Cd/A) | Voltage (V) | Emission efficiency (lm/W) |
|---|---|---|---|---|---|---|
| Example 2 | A | MoO₃ | (0.145, 0.054) | 5.0 | 5.48 | 2.9 |
| | B | | (0.146, 0.052) | 5.1 | 3.67 | 4.4 |
| | C | | (0.145, 0.057) | 4.5 | 3.44 | 4.1 |
| | D | | (0.145, 0.058) | 3.4 | 3.44 | 3.1 |
| | E | | (0.147, 0.058) | 2.7 | 3.40 | 2.5 |

Comparative Example 1

An organic EL element was produced in the same way as that with light-reflective electrode A of Example 2 except that the electrode was not coated with a $MoO_3$ layer. Measurement of the characteristics of the organic EL element of Comparative Example 1 by the method described in Example 2 was impossible because it did not emit light at a voltage of 10 V or below.

The results shown in Table 2 and from Comparative Example 1 indicate that forming a Mo containing layer on the Al layer reduces the driving voltage. It appears that the formation of the Mo containing layer improves the hole injection properties. A Mo layer with a thickness of more than 0 nm to 3.5 nm, inclusive, also enhances the emission efficiency.

Furthermore, forming a Mo layer on the Al layer first is more effective in reducing the driving voltage than forming a $MoO_3$ layer directly on the Al layer. This is believed to be because cleaning the substrate by treatment with UV and ozone caused the surface of the Al layer to be partially oxidized.

Light-reflective electrodes B to E must have been oxidized by this UV-ozone treatment and a $MoO_3$ film must have been formed on the surface of their Mo layer. In other words, the Mo layer of these electrodes must have been a laminate of a metallic Mo film and a molybdenum oxide film. This was confirmed by the following experiment.

The surface of light-reflective electrode C (a laminate of an Al layer and a 3.5-nm Mo layer) was treated with UV and ozone and this electrode was analyzed by spectroscopic ellipsometry at several time points for the dependence of the thickness of the surface coating oxide film on the duration of treatment. Table 3 summarizes the results. The analytical process consisted of measuring the thickness of the light-reflective electrode on a cross-sectional image obtained by scanning reflection electron microscopy and fitting ellipsometric data to a model based on the measured thickness and the refractive indices of Mo and $MoO_3$ in the literature.

TABLE 3

| | UV-ozone treatment duration (min) | | | | |
|---|---|---|---|---|---|
| | 0 | 2 | 5 | 10 | 30 |
| $MoO_3$ film thickness (nm) | 0.6 | 1.3 | 1.6 | 3.3 | 4.8 |
| Mo film thickness (nm) | 3.1 | 2.8 | 2.5 | 2.3 | 2.2 |
| Entire Mo layer thickness (nm) | 3.7 | 4.1 | 4.1 | 5.6 | 7.0 |
| Reflectivity at 450 nm (%) | 84 | 87 | 88 | 89 | 89 |

The results in Table 3 indicate that treatment with UV and ozone forms a $MoO_3$ layer on the metallic Mo layer. Even at 0 minutes (i.e., less than one minute) of UV-ozone treatment the formation of a $MoO_3$ layer was observed and the thickness of the entire Mo layer was 3.7 nm, longer than the baseline. This is probably because the surface of the Mo layer was oxidized while the test specimen was out in the air for measurement.

The results also indicate that the metallic Mo film gets thinner and the $MoO_3$ layer grows with prolonged UV-ozone treatment. This is thought to be because during the treatment with UV and ozone the density and crystallographic structure of the $MoO_3$ layer changed as the surface oxidation of the metallic Mo film proceeded. The increased thickness of the entire Mo layer makes this layer an effective barrier layer for the protection of the Al layer. The thickness of the metallic Mo layer was maintained in the range of 2 nm to 3 nm while the test specimen was under the UV-ozone treatment. Furthermore, the reflectivity was not reduced but rather improved despite the increased thickness of the $MoO_3$ layer as laminar $MoO_3$ is relatively transparent.

Example 3

The next experiment was to determine the dependence of driving voltage on the duration of UV-ozone treatment. Blue organic EL elements were produced in the same way as that with light-reflective electrode C of Example 2 except that the duration of treatment with UV and ozone was 0 minutes or 2 minutes. Table 4 summarizes their driving voltage measured at a current density of 25 mA/cm$^2$.

TABLE 4

| | UV-ozone treatment duration (min) | Voltage (V) |
|---|---|---|
| Example 3 | 0 | 6.88 |
| | 2 | 3.48 |
| Example 2 | 10 | 3.44 |

As can be seen from Table 4, the element not treated with UV and ozone required a high voltage to operate. This means that the lowering effect of the Mo layer on the driving voltage is increased when there is a $MoO_3$ layer formed in the interface with the organic compound layer, probably because the hole injection properties of $MoO_3$ are more potent than those of Mo. Furthermore, the change in the duration of UV-ozone treatment from 10 minutes to 2 minutes had little influence on the driving voltage; a $MoO_3$ layer with a thickness of 1 nm is enough.

Example 4

A light emitting apparatus having red, green, and blue organic EL elements was produced.

Low-temperature polysilicon thin film transistors (TFTs) were formed on a glass substrate, and the TFTs were coated with a 300-nm first insulating layer made of silicon nitride and then with a 1.5-μm second insulating layer made of acrylic resin. The first and second insulating layers were perforated so that the drain electrode of each TFT should be exposed.

Subsequently, a first electrode was formed by depositing a 100-nm Al layer (first layer) and a 2.1-nm Mo layer (second layer) both by sputtering. Therefore the first electrode was a laminate of the first and second layers stacked in this order from the substrate side.

The first and second layers were then simultaneously patterned, covering the region from the position where the emission area of each organic EL element would later be located to the opening formed above the drain electrode of each TFT with the TFT and the first layer in contact with each other.

A 1.5-μm third insulating layer covering the edge of the first electrode was then prepared by patterning a polyimide resin film. The glass substrate was then treated with UV and ozone under reduced pressure for 10 minutes and thereby its surface was cleaned.

After that, a first hole transport layer was formed by vacuum deposition of a 25-nm film of compound 1 covering the entire area in which the organic EL elements would later be made. The pressure was $1.0 \times 10^{-4}$ Pa.

A second hole transport layer was then formed by covering only the positions where red pixels would later be located with a 45-nm film of compound 1 by vacuum deposition through a metallic mask patterned to define the pixels.

A 25-nm red-light emitting layer was then formed on the second hole transport layer through the pixel-patterned metallic mask so that the positions for red pixels should be occupied. The red-light emitting layer was deposited by co-evaporation of compound 6 (a host material), compound 7 (4% by weight, an emitting dopant), and compound 8 (15% by weight, an auxiliary dopant). The combination of compounds 6 and 7 in the red-light emitting layer satisfies formula 9; the light emitting point was therefore on the electron transport layer side.

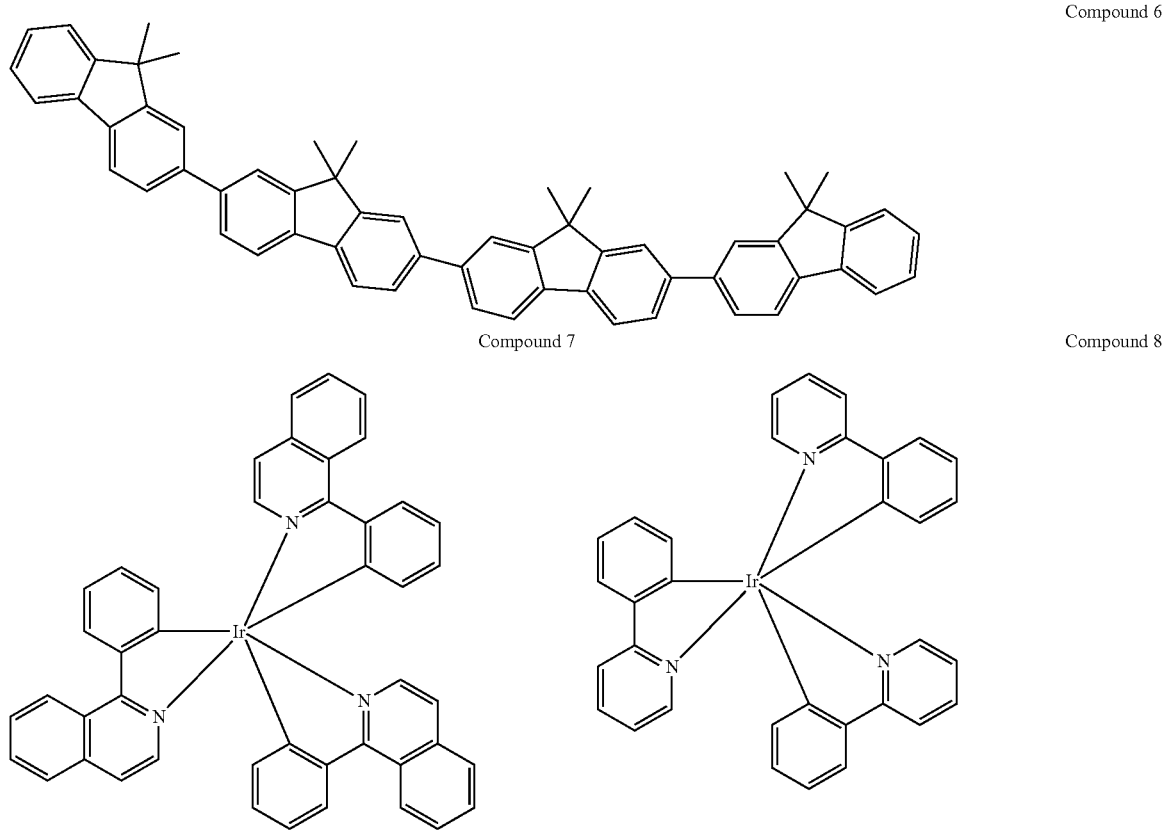

Compound 6

Compound 7

Compound 8

Subsequently, a 35-nm green-light emitting layer was formed through another pixel-patterned metallic mask to occupy the positions for green pixels on the first hole transport layer. The green-light emitting layer was deposited by co-evaporation of compound 9 (a host material) and compound 10 (2.5% by weight, an emitting dopant). The combination of compounds 9 and 10 in the green-light emitting layer satisfies formula 9; the light emitting point was therefore on the electron transport layer side.

-continued

Compound 10

Compound 9

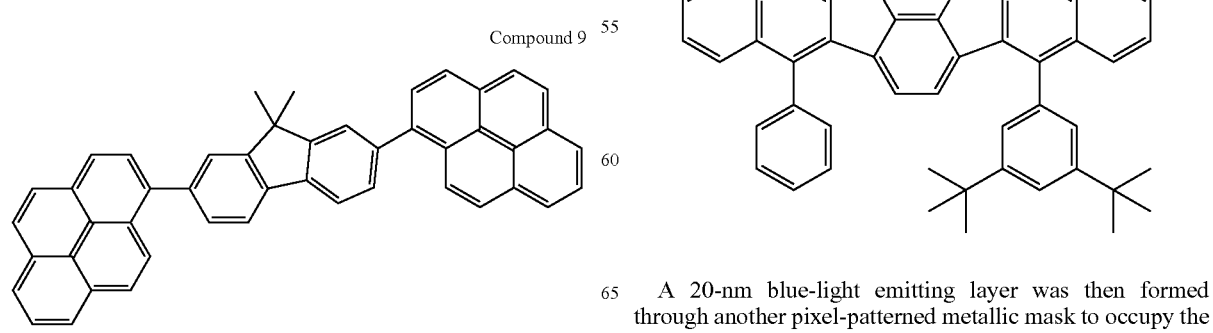

A 20-nm blue-light emitting layer was then formed through another pixel-patterned metallic mask to occupy the positions for blue pixels on the first hole transport layer. The blue-light emitting layer was deposited by co-evaporation of compound 2 (a host material) and compound 3 (1.0% by weight, an emitting dopant). The combination of compounds 2 and 3 in the blue-light emitting layer satisfies formula 10; the light emitting point was therefore on the electron transport layer side.

Subsequently, an exciton blocking layer was formed by depositing a 10-nm film of compound 4, an electron transport layer was formed by depositing a 10-nm film of compound 5, and then an electron injection layer was formed by depositing a 10-nm film containing compound 5 and 20% by weight of cesium carbonate by co-evaporation.

A 25-nm second electrode was then formed by depositing an Ag layer, and an optical adjustment layer was formed by depositing a 70-nm film of compound 5. In this way, organic EL elements were obtained.

These organic EL elements were then sealed by bonding a sealing glass sheet containing a desiccant to the film coated surface of the glass substrate with an epoxy resin adhesive in a nitrogen atmosphere in a glovebox.

Analysis of the light generated using this light emitting apparatus revealed the following results on the wavelength of the highest peak in the emission spectrum of red, green, and blue organic EL elements: $\lambda_R$=623 nm, $\lambda_G$=517 nm, and $\lambda_B$=450 nm.

Table 5 summarizes the first and second optical lengths of the organic EL elements of each color along with the optical lengths calculated by formulae 2 and 6. The optical lengths based on the configuration of Example 4 and those calculated by formulae 2 and 4 were almost equal for the organic EL elements of all colors, i.e., red, green, and blue. Besides these, the configuration of Example 4 satisfied formulae 4, 5, 7, and 8.

TABLE 5

|  |  | Red | Green | Blue |
|---|---|---|---|---|
| First optical length (nm) | Example 4 | 126 | 102 | 81 |
|  | Calculated by formula 2 | 123 | 101 | 83 |
| Second optical length (nm) | Example 4 | 117 | 85 | 72 |
|  | Calculated by formula 6 | 112 | 86 | 70 |

Table 6 summarizes the EL characteristics of the organic EL elements of each color of Example 4 measured at a current density of 25 mA/cm².

TABLE 6

|  | CIE chromaticity coordinates (x, y) | Current efficiency (Cd/A) | Voltage (V) | Emission efficiency (lm/W) |
|---|---|---|---|---|
| Red pixels | (0.681, 0.319) | 29.0 | 4.22 | 21.6 |
| Green pixels | (0.208, 0.712) | 52.0 | 4.12 | 39.7 |
| Blue pixels | (0.146, 0.052) | 5.1 | 3.67 | 4.4 |

A light emitting apparatus can be obtained in this way which has red, green, and blue organic EL elements and can operate at a low driving voltage with a high emission efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-018816 filed Jan. 31, 2012, which is hereby incorporated by reference herein in its entirety.

What is claimed is:

1. A light emitting apparatus comprising:
a substrate;
organic EL elements, the organic EL elements formed on the substrate and each having a first electrode, a light emitting layer, and a second electrode; and
transistors, the transistors formed on the substrate and each connected to the first electrode of each organic EL element, wherein
a first optical length $L_1$ between an emission point of the light emitting layer and a reflection surface of the first electrode, satisfies formula A, and
wherein the first electrode comprises a first layer and a second layer covering the first layer;
the first layer containing Al and connected to one of the transistors:
the second layer containing Mo and/or W:

$$L_1>0, (\lambda/8)\times(-1-2\Phi_1/\pi)<L_1<(\lambda/8)\times(1-2\Phi_1/\pi) \quad \text{Formula A}$$

where $\lambda$ denotes a wavelength of a highest peak in an emission spectrum of each organic EL element, and $\Phi_1$ denotes a phase shift at the reflection surface of the first electrode at the wavelength $\lambda$.

2. The light emitting apparatus according to claim 1, wherein the first electrode further comprises a third layer covering the second layer, the third layer containing a molybdenum oxide and/or a tungsten oxide, the metallic film and the oxide film formed in this order from the first layer side.

3. The light emitting apparatus according to claim 1, wherein a second optical length $L_2$ between the emission point of the light emitting layer and a reflection surface of the second electrode, satisfies formula B:

$$L_2>0, (\lambda/8)\times(-1-2\Phi_2/\pi)<L_2<(\lambda/8)\times(1-2\Phi_2/\pi) \quad \text{Formula B}$$

where $\Phi_2$ denotes a phase shift at the reflection surface of the second electrode at the wavelength $\lambda$.

4. An image forming apparatus comprising:
the light emitting apparatus according to claim 1;
a photosensitive member on which the light emitting apparatus forms a latent image; and
a charging unit configured to charge the photosensitive member.

5. A display apparatus comprising:
a substrate;
organic EL elements, the organic EL elements formed on the substrate and each having a first electrode, a light emitting layer, and a second electrode; and
transistors, the transistors formed on the substrate and each connected to the first electrode of each organic EL element, wherein
a first optical length $L_1$ between an emission point of the light emitting layer and a reflection surface of the first electrode, satisfies formula C, and
wherein the first electrode comprises a first layer, a second layer covering the first layer and a third layer covering the second layer;
the first layer containing Al and connected to one of the transistors:
the second layer containing Mo and/or W:

$$L_1>0, (\lambda/8)\times(-1-2\Phi_1/\pi)<L_1<(\lambda/8)\times(1-2\Phi_1/\pi) \quad \text{Formula C}$$

where $\lambda$ denotes a wavelength of a highest peak in an emission spectrum of each organic EL element, and $\Phi_1$ denotes a phase shift at the reflection surface of the first electrode at the wavelength λ.

6. The display apparatus according to claim 5, wherein the organic EL elements include organic EL elements of different colors.

7. An image pickup apparatus comprising the display apparatus according to claim 5 and an image sensor.

8. The display apparatus according to claim 5, wherein the second layer contains Mo.

9. The display apparatus according to claim 8, wherein the first electrode further comprises a third layer covering the second layer, the third layer containing a molybdenum oxide, the metallic film and the oxide film formed in this order from the first layer side.

10. The display apparatus according to claim 5, wherein the second layer contains W.

11. The display apparatus according to claim 10, wherein the first electrode further comprises a third layer covering the second layer, the third layer containing a tungsten oxide, the metallic film and the oxide film formed in this order from the first layer side.

12. The display apparatus according to claim 5, wherein the second layer contains Mo and W.

13. The display apparatus according to claim 12, wherein the first electrode further comprises a third layer covering the second layer, the third layer containing a molybdenum oxide and tungsten oxide, the metallic film and the oxide film formed in this order from the first layer side.

14. The light emitting apparatus according to claim 1, wherein the thickness of the second layer is 2 nm or more and 9 nm or less.

15. The light emitting apparatus according to claim 2, wherein the thickness of the third layer is 1 nm or more and 5 nm or less.

16. The display apparatus according to claim 5, wherein the thickness of the second layer is 2 nm or more and 9 nm or less.

17. The display emitting apparatus according to claim 9, wherein the thickness of the third layer is 1 nm or more and 5 nm or less.

18. The display emitting apparatus according to claim 11, wherein the thickness of the third layer is 1 nm or more and 5 nm or less.

19. The display emitting apparatus according to claim 13, wherein the thickness of the third layer is 1 nm or more and 5 nm or less.

* * * * *